(12) United States Patent
Xu

(10) Patent No.: US 9,114,445 B2
(45) Date of Patent: Aug. 25, 2015

(54) BURNING-FREE AND NON-CYANIDE METHOD FOR RECYCLING WASTE PRINTED CIRCUIT BOARD

(75) Inventor: Kaihua Xu, Shenzhen (CN)

(73) Assignee: GEM CO., LTD., Shenzhen, Guangdong (CN)

( * ) Notice: Subject to any disclaimer, the term of this patent is extended or adjusted under 35 U.S.C. 154(b) by 246 days.

(21) Appl. No.: 14/001,245

(22) PCT Filed: Jul. 28, 2011

(86) PCT No.: PCT/CN2011/077720
§ 371 (c)(1),
(2), (4) Date: Aug. 23, 2013

(87) PCT Pub. No.: WO2012/122774
PCT Pub. Date: Sep. 20, 2012

(65) Prior Publication Data
US 2013/0326850 A1   Dec. 12, 2013

(30) Foreign Application Priority Data

Mar. 11, 2011 (CN) .......................... 2011 1 0059739

(51) Int. Cl.
| | | |
|---|---|---|
| *C22B 3/00* | (2006.01) | |
| *B02C 23/08* | (2006.01) | |
| *B09B 5/00* | (2006.01) | |
| *H05K 3/22* | (2006.01) | |
| *H05K 3/26* | (2006.01) | |
| *C22B 7/00* | (2006.01) | |
| *B02C 23/10* | (2006.01) | |
| *B09B 3/00* | (2006.01) | |

(52) U.S. Cl.
CPC . *B09B 5/00* (2013.01); *B02C 23/08* (2013.01); *B02C 23/10* (2013.01); *B09B 3/0016* (2013.01); *C22B 7/001* (2013.01); *C22B 7/005* (2013.01); *C22B 11/046* (2013.01); *H05K 3/22* (2013.01); *H05K 3/225* (2013.01); *H05K 3/26* (2013.01); *H05K 2203/178* (2013.01); *Y02W 30/54* (2015.05); *Y02W 30/822* (2015.05); *Y10T 29/49156* (2015.01); *Y10T 29/49755* (2015.01)

(58) Field of Classification Search
CPC .............. B03B 1/04; B29B 2017/0268; B29B 2017/0213; B29B 2017/0296; B29B 2017/0293; B29B 2017/0289; B29B 2017/0286; Y10T 29/49753; Y10T 29/49751; Y10T 29/49757; Y10T 29/49755; C22B 7/007; C22B 3/165; C22B 11/0046; C22B 7/00; C22B 7/005; B03C 9/00; B02C 23/08; Y02W 30/54; Y02W 30/822; Y02W 30/82; H05K 3/26; H05K 3/225; H05K 3/22
See application file for complete search history.

(56) References Cited

U.S. PATENT DOCUMENTS

| 6,641,712 B1 * | 11/2003 | Gibson et al. ................. 205/349 |
| 2004/0103512 A1 * | 6/2004 | Fitch ........................... 29/403.3 |
| 2004/0181923 A1 * | 9/2004 | Dills ............................ 29/403.3 |
| 2010/0275730 A1 * | 11/2010 | Lee et al. ......................... 75/403 |

FOREIGN PATENT DOCUMENTS

| EP | 1811821 A1 * | 7/2007 |
| WO | WO 2011130622 A1 * | 10/2011 |

* cited by examiner

*Primary Examiner* — Jermie Cozart
(74) *Attorney, Agent, or Firm* — Shimokaji & Associates, P.C.

(57) ABSTRACT

A burning-free and non-cyanide method for recycling waste printed circuit board is provided, comprising the following steps: desoldering to separate lead and tin; crashing and electrostatic selecting to respectively extract stibium, aluminum, copper, nickel, silver, gold, platinum and palladium. The method can realize the maximization of recycling of valuable metal resources, can thoroughly separate the metal lead and tin for recycling, and meanwhile increase the recycling rate of the metal palladium.

10 Claims, No Drawings

BURNING-FREE AND NON-CYANIDE METHOD FOR RECYCLING WASTE PRINTED CIRCUIT BOARD

PRIORITY INFORMATION

The present application claims priority to Chinese Application No. 201110059739.6, entitled Burning-free and Non-cyanide Method for Recycling Waste Printed Circuit Board, filed on Mar. 11, 2011, the entire contents of which are hereby incorporated by reference.

FIELD OF THE INVENTION

The present invention relates to treatment of industrial waste, more particularly, relates to burning-free and non-cyanide method for recycling waste printed circuit board.

BACKGROUND OF THE INVENTION

As people's living standards improve, the number of waste printed circuit board (PCB) from waste home appliances is increasing with the upgrade of various home appliances. If discarded directly, such PCB would not only take up a lot of land resources, but also result in a waste of valuable metal resources. In addition, polyvinyl chloride, halide flame retardants and other hazardous substances thereof will cause huge pollution to the surrounding environment. Therefore, how to effectively deal with waste printed circuit board, to realize recycling and reuse of printed circuit board has become a serious problem to be solved.

Recycling techniques used commonly comprise pyrometallurgy, wet cyanidation metallurgy or combination thereof. However, the methods of pyrometallurgy and wet cyanidation metallurgy pollute the environment seriously, especially the traditional wet process cyanidation metallurgy, which may cause great environmental pollution owing to the highly toxic substances cyanide.

Moreover, it is generally limited to the recycling of copper and noble metals (such as gold, silver, platinum and/or palladium) from waste printed circuit board in the prior art, for example, method for recycling copper from waste circuit board disclosed in CN101270411A, and method for extracting gold from waste circuit board disclosed in CN101230421A, however, such methods ignored the recycling of tin, lead, antimony and aluminum from solder.

CN101787547A discloses a method for extracting primary products of copper, nickel, silver, gold, platinum and palladium, and other byproducts of lead, tin, antimony and aluminum from waste printed circuit board, which maximizes the reuse of valuable metal resources. However, the lead-containing byproduct $Na_2PbO_3$ and tin-containing byproduct $Na_2SnO_3$ are mixed and crystallized in the same step in this method, thus they cannot be completely separated and recycled, and need to return to smelter where lead or tin can be smelted for extraction. Furthermore, the means of recycling metallic silver in such method involves dissolving silver-containing residues in nitric acid solution, and obtaining electrowinning silver after electrowinning Nevertheless, metallic palladium will be also dissolved while silver is dissolved in nitric acid solution, which will lead to a low recycling rate of palladium in the subsequent recycling process.

SUMMARY OF THE INVENTION

In order to solve the above-mentioned problem, the present invention aims to provide a burning-free and non-cyanide method for recycling waste printed circuit board. The method can realize the maximization of recycling of valuable metal resources, can thoroughly separate the metal lead and tin for recycling, and meanwhile increase the recycling rate of the metal palladium.

A burning-free and non-cyanide method for recycling waste printed circuit board is provided in the present invention, comprising the following steps:

(1) desoldering treatment: providing waste printed circuit board, washing, drying, immersing in nitric acid type stripping solution for desoldering treatment, after the desoldering treatment, said waste printed circuit board proceeds to step (3), spent stripping solution thereof proceeds to step (2);

(2) separation of lead and tin: providing said spent stripping solution from step (1), stirring under a temperature in a range of from 60° C. to 95° C., adding oxidant, regulating pH to from 2.5 to 3.0 by adding alkali, reacting for from 1 to 3 h to precipitate $Fe^{3+}$ and $Sn^{4+}$ while leaving lead ions and copper ions remaining in solution, filtering and separating solid and liquid, obtaining tin-containing residues and lead-containing filtrate, recycling tin and lead respectively;

(3) crush and electrostatic separation: providing said desoldering treated circuit board from step (1), drying, crushing roughly, eddy current separating, crushing finely and electrostatic separating, removing robber and plastic materials, obtaining metal-rich part powders;

(4) extraction of lead, antimony and aluminium: providing said metal-rich part powders from step (3), leaching Pb ions, Sb ions and Al ions, filtering, evaporating and concentrating filtrate to obtain mixed crystals of $Na_2PbO_3$, $Na_2SbO_3$ and $NaAlO_2$, evaporating mother liquor to return back for water leaching, residues without lead, antimony and aluminium proceed to step (5);

(5) extraction of copper: providing said residues without lead, antimony and aluminium from step (4), adding 0.5~3.5 mol/L of sulfuric acid solution and oxidant, leaching at a temperature in a range of from 20° C. to 70° C. for from 2 h to 8 h, filtering the leached solution, selectively cyclone electrowinning copper, the conditions therein comprise: pH value of electrolyte is in a range of from 1.0 to 5.0, temperature is in a range of from 20° C. to 60° C., current density is in a range of from 200 A/m² to 550 A/m², time of electrowinning is in a range of from 0.5 h to 4 h, obtaining electrowinning copper, residues without copper proceed to step (7);

(6) extraction of nickel: providing the remaining solution from step (5), selectively cyclone electrowinning nickel, the conditions therein comprise: pH value of electrolyte is in a range of from 1.0 to 5.0, temperature is in a range of from 20° C. to 70° C., current density is in a range of from 200 A/m² to 450 A/m², time of electrowinning is in a range of from 0.5 h to 4 h, obtaining electrowinning nickel, the remaining solution is returned back for sulfuric acid leaching;

(7) extraction of silver: providing said residues without copper from step (5), adding nitric acid solution according to the concentration ratio of residues to nitric acid solution that 1:1~3 to dissolve silver and palladium, holding the temperature at from 25° C. to 85° C. and leaching for from 0.5 h to 3 h, filtering and separating solid and liquid, obtaining silver-and-palladium-containing filtrate, and obtaining residues without silver and palladium, then regulating pH value of silver-and-palladium-containing filtrate to from 3 to 5, stirring continuously at normal temperature, adding NaOH solution to precipitate palladium while leaving silver ions remaining in the solution, filtering and separating solid and liquid, obtaining silver-containing filtrate and palladium-containing precipitates, adding sodium chloride to said silver-containing filtrate to precipitate silver, filtering and separating solid and liquid, obtaining silver chloride precipitates, residues without silver and palladium proceed to step (8);

(8) extraction of gold: providing said residues without silver and palladium from step (7), adding aqua regia in an amount by mass of 1~5 times the residues, stirring under a temperature in a range of from 20° C. to 70° C. at a speed in a range of from 100 r/min to 1000 r/min, leaching for from 1 h to 2.5 h; cyclone electrowinning gold in the leached liquid, the conditions therein comprise: temperature is in a range of from 20° C. to 60° C., current density is in a range of from 50 A/m$^2$ to 400 A/m$^2$, time of electrowinning is in a range of from 0.5 h to 4 h, pH value of electrolyte is in a range of from 1.0 to 5.5, obtaining electrowinning gold, the remaining solution proceeds to step (9);

(9) extraction of platinum: providing the remaining solution from step (8), adding saturated NH$_4$Cl to react for from 2 h to 8 h, then filtering, residues are ammonium chloroplatinate, platinum sponge is obtained after refinement, filtrate without platinum proceeds to step (10);

(10) secondary extraction of palladium: providing said filtrate without platinum from step (9), adding methanoic acid according to the mass ratio of palladium to methanoic acid that 0.5~3:1, reacting for from 0.5 h to 2 h while vigorously stirring at a temperature in a range of from 50° C. to 90° C., holding pH value at from 6.0 to 9.0, obtaining raw palladium powders.

As described herein, step (1) refers to means for disassembling waste printed circuit board by desoldering treatment to remove tin solder completely and gather metallic lead and tin effectively.

Normally, the thickness of the copper-tin alloy layer between tin-lead alloy layer deposited on circuit board and copper layer on the base is in the range of from 0.05 μm to 0.1 μm, and increases with time. So, strong oxidants are required for waste printed circuit board to remove tin solder. The stripping solution described in the present invention refers to nitric acid type, whose oxidation system consists of nitric acid and ferric nitrate/ferric chloride. Preferably, the nitric acid type stripping solution of the present invention contains the following components in weight percent: nitric acid 15~50%, ferric nitrate or ferric chloride 1~20%, sulfonic acid 1~5% and water for the rest.

As described herein, nitric acid is main oxidant for dissolving tin solder. Nitric acid having a mass fraction of 68% is optional. Since tin is not active metal, tin reacts with acid very slowly. Compared to existing stripping solution, the stripping solution as described in the present invention increases the concentration of nitric acid, and effectively improves the corrosion rate of the solder.

Fe$^{3+}$ in ferric nitrate or ferric chloride has strong oxidizing property, adding ferric nitrate or ferric chloride can improve the oxidizing ability of stripping solution, thus effectively improving the speed of solder dissolution, meanwhile, helping to promote corrosion of copper-tin alloy layer.

In the process of stripping tin, tin exists in solution mainly in the form of Sn$^{2+}$. As Sn$^{2+}$ is easy to be oxidized to Sn$^{4+}$ by concentrated nitric acid and oxygen in the air, and Sn$^{4+}$ is prone to hydrolyze to produce β-stannic acid precipitates, impacting the dissolution of tin solder due to the stannic acid attached to the tin solder, so that sulfur acid is required to be added to the stripping solution. The role of sulfonic acid is to form stable complexes with Sn$^{2+}$ in the solution, to promote the dissolution of the tin solder. Meanwhile, sulfonic acid is strong acid, which can effectively inhibit decomposition of nitric acid in the stripping solution. From the raw material cost considerations, sulfamic acid selected from sulfonic acid is more preferred.

More preferably, the nitric acid type stripping solution described in the present invention contains the following components in weight percent: nitric acid 30~50%, ferric nitrate or ferric chloride 10~18%, sulfonic acid 3~5% and water for the rest. Further preferably, the nitric acid type stripping solution described in the present invention contains the following components in weight percent: nitric acid 50%, ferric nitrate or ferric chloride 18%, sulfonic acid 5% and water for the rest.

The stripping solution of the present invention is only used for soldering the tin solder on waste printed circuit board. Such waste printed circuit board cannot be reused anymore, without regard to the protection of copper circuit board on the PCB, there is no need to add corrosion inhibitor to the stripping solution of the present invention. The stripping solution of the present invention has simple components and fast stripping speed.

The method for manufacturing the stripping solution of the present invention comprises: providing ferric nitrate or ferric chloride sulfonic acid and dissolving completely in water, adding nitric acid, stirring well, obtaining said stripping solution of the present invention.

In step (1), time of desoldering treatment is in a preferred range of from 10 min to 25 min. Said waste printed circuit board proceeds to step (3) after the desoldering treatment.

The content of metallic tin in spent stripping solution formed in the desoldering process is up to 60~100 g/L (the current price of metallic tin is up to about 150,000 yuan/ton), metallic tin has great recovery value. Meanwhile, the spent stripping solution further contains lead ions having a concentration of about 24~36 g/L (the desoldering process is only for dissolving part of the metallic lead, the remaining undissolved metallic lead will be extracted in step (4)), in order to separately recycle lead and tin ions of the spent stripping solution, the spent stripping solution proceeds to step (2).

Step (2) refers to means for separating lead and tin: providing said spent stripping solution from step (1), stirring under a temperature in a range of from 60° C. to 95° C., adding oxidant, regulating pH to from 2.5 to 3.0 by adding alkali, reacting for from 1 h to 3 h to precipitate Fe$^{3+}$ and Sn$^{4+}$ while leaving lead ions and copper ions remaining in solution, filtering and separating solid and liquid, obtaining tin-containing residues and lead-containing filtrate, recycling tin and lead respectively. As described herein, oxidant can be hydrogen peroxide, sodium chlorate and other normal oxidants.

Considering that tin-containing residues may be mixed with low concentration of iron ions, and lead-containing filtrate may be mixed with low concentration of copper ions, preferably, tin-containing residues and/or lead-containing filtrate can be further purified.

Preferably, the step of recycling tin from step (2) refers to means for purifying tin-containing residues: providing tin-containing residues and pulpifying with water, adding ammonium sulfite to reduce to Sn(OH)$_2$ precipitates, then adding alkali to regulate pH value to from 13 to 14, reacting at a temperature in a range of from 50° C. to 95° C. for from 1 h to 4 h to transform Sn(OH)$_2$ precipitates into soluble [Sn(OH)$_4$]$^{2-}$, filtering, the residues are ferric hydroxide which are returned back for leaching, adding sulfuric acid to filtrate, regulating pH value back to from 3 to 7 to transform [Sn(OH)$_4$]$^{2-}$ into Sn(OH)$_2$, filtering, regulating pH value of Sn(OH)$_2$ to from 0.5 to 1, dissolving and forming tin sulfate solution, then concentrating and crystallizing to form tin sulfate crystals.

Preferably, the step of recycling lead from step (2) refers to means for purifying lead-containing filtrate: providing lead-containing filtrate, adding sodium sulfate at a temperature in a range of from 60° C. to 95° C. according to excess coefficient of lead that 1.1~1.5, reacting for from 0.5 h to 5 h while stirring, filtering, residues are lead sulfate, filtrate is copper-containing filtrate; providing lead sulfate residues and pulpifying, after that, adding sodium carbonate at a temperature in a range of from 60° C. to 95° C., regulating pH value to from 9 to 10, reacting for from 2 h to 5 h to transform lead sulfate into tribasic lead sulfate products. Copper-containing filtrate can be transferred to the leached solution from step (5).

Step (3) comprises drying, crushing roughly, eddy current separating, crushing finely and electrostatic separating, with the purpose of crushing and preliminarily purifying the desoldering treated circuit board from step (1), and removing rubber and plastic materials mixed therein to obtain metal-rich part powders.

Step (4) involves leaching Pb ions, Sb ions and Al ions from said metal-rich part powders from step (3), evaporating and concentrating leached solution to obtain mixed crystals of $Na_2PbO_3$, $Na_2SbO_3$ and $NaAlO_2$, evaporating mother liquor to return back for water leaching, residues without lead, antimony and aluminium proceed to step (5).

As described herein, the process of leaching refers to the process of separating amphoteric metals lead, antimony and aluminium from copper, noble metal and platinum group metals. No limitations to the methods.

Preferably, the step of leaching Pb ions, Sb ions and Al ions comprises: roasting the metal-rich part powders at a temperature in a range of 300° C. to 500° C. for from 1 h to 5 h for the purpose of oxidizing lead, antimony, aluminium, copper, nickel and other metals, then leaching the roasted materials with alkali for from 2 h to 6 h, the liquid-solid ratio is in a range of 2~5:1, the temperature of leaching is in a range of 60° C. to 90° C. Only lead oxide, antimony oxide and aluminium oxide in the roasted materials are amphoteric oxides, which can dissolve in alkali.

Preferably, the step of leaching Pb ions, Sb ions and Al ions comprises: thoroughly mixing metal-rich part powders with fusion agent which is $NaOH:NaNO_3=1:0~1$ according to the mass ratio of metal-rich part powders to fusion agent that 1:0.1~1, smelting at a low temperature in a range of 350° C. to 550° C. for from 1 h to 3.5 h, the smelted materials are leached out with hot water after cooling and levigating, liquid-solid ratio is in a range of 1~5:1, temperature of leaching is in a range of from 20° C. to 40° C. This is the use of the principle that metal powders react with alkaline medium and oxidant at a low melting temperature, to separate alkaline melt from the solid substances, more specifically, to separate amphoteric metals lead, antimony and aluminum from copper, noble metals and platinum group metals.

Step (5) refers to means for extracting copper: providing said residues without lead, antimony and aluminium from step (4), adding 0.5~3.5 mol/L of sulfuric acid solution and oxidant, leaching at a temperature in a range of from 20° C. to 70° C. for from 2 to 8 h, filtering the leached solution, selectively cyclone electrowinning copper, the conditions therein comprise: pH value of electrolyte is in a range of from 1.0 to 5.0, temperature is in a range of from 20° C. to 60° C., current density is in a range of from 200 $A/m^2$ to 550 $A/m^2$, time of electrowinning is in a range of from 0.5 h to 4 h, obtaining electrowinning copper, residues without copper proceed to step (7). Oxidant can be peroxysulphate, ozone or hydrogen peroxide.

Step (6) refers to means for extracting nickel: providing the remaining solution from step (5) and selectively cyclone electrowinning nickel, the conditions therein comprise: pH value of electrolyte is in a range of from 1.0 to 5.0, temperature is in a range of from 20° C. to 70° C., current density is in a range of from 200 $A/m^2$ to 450 $A/m^2$, time of electrowinning is in a range of from 0.5 h to 4 h, obtaining electrowinning nickel, the remaining solution is returned back for sulfuric acid leaching.

Step (7) refers to means for extracting silver: providing said residues without copper from step (5), adding nitric acid solution according to the concentration ratio of residues to nitric acid solution that 1:1~3 to dissolve silver and palladium, holding the temperature at from 25° C. to 85° C. and leaching for from 0.5 h to 3 h, filtering and separating solid and liquid, obtaining silver-and-palladium-containing filtrate, and obtaining residues without silver and palladium, then regulating pH value of silver-and-palladium-containing filtrate to from 3 to 5, stirring continuously at normal temperature, adding NaOH solution to precipitate palladium while leaving silver ions remaining in the solution, filtering and separating solid and liquid, obtaining silver-containing filtrate and palladium-containing precipitates, adding sodium chloride to said silver-containing filtrate to precipitate silver, filtering and separating solid and liquid, obtaining silver chloride precipitates, residues without silver and palladium proceed to step (8).

Step (8) refers to means for extracting gold: providing said residues without silver and palladium from step (7), adding aqua regia in an amount by mass of 1~5 times the residues, stirring under a temperature in a range of from 20° C. to 70° C. at a speed in a range of from 100 r/min to 1000 r/min, leaching for from 1 h to 2.5 h; cyclone electrowinning gold in the leached liquid, the conditions therein comprise: temperature is in a range of from 20° C. to 60° C., current density is in a range of from 50 $A/m^2$ to 400 $A/m^2$, time of electrowinning is in a range of from 0.5 h to 4 h, pH value of electrolyte is in a range of from 1.0 to 5.5, obtaining electrowinning gold, the remaining solution proceeds to step (9);

Step (9) refers to means for extracting platinum: providing the remaining solution from step (8), adding saturated $NH_4Cl$ to react for from 2 h to 8 h, then filtering, residues are ammonium chloroplatinate, platinum sponge is obtained after refinement, filtrate without platinum proceeds to step (10);

Step (10) refers to secondary extraction of palladium: providing said filtrate without platinum from step (9), adding methanoic acid according to the mass ratio of palladium to methanoic acid that 0.5~3:1, reacting for from 0.5 h to 2 h while vigorously stirring at a temperature in a range of from 50° C. to 90° C., holding pH value at from 6.0 to 9.0, obtaining raw palladium powders.

The burning-free and non-cyanide method for recycling waste printed circuit board provided in the present invention has the following beneficial effects:

(1) Maximizing the reuse of valuable metal resources, thoroughly recycling metallic lead and tin separately and meanwhile increasing the recycling rate of metallic palladium.

(2) Being able to solve the problem that a lot of land resources have been took up by discarded waste printed circuit board, and to solve the environmental pollution problem caused by hazardous materials of waste printed circuit board;

(3) The present invention without burning and cyaniding steps is simple, low energy consumption and environment-friendly.

DETAILED DESCRIPTION OF ILLUSTRATED EMBODIMENTS

The following description will depict preferred embodiments of the present invention in more detail. It should be noted that, those skilled in the art will recognize that the invention can be practiced with modification within the spirit of the principle, and the modification is also within the scope of protection of the present invention.

Example 1

The burning-free and non-cyanide method for recycling waste printed circuit board, comprising:

(1) Desoldering treatment:

Ferric nitrate or ferric chloride, sulfonic acid were provided and completely dissolved in water. Nitric acid was added according to the following proportion, and uniform stirring was started. Nitric acid type stripping solution of the present invention was obtained: nitric acid 50%, ferric nitrate 18%, sulfamic acid 5% and water for the rest.

Waste printed circuit board was provided, then washed, dried and immersed in nitric acid type stripping solution for desoldering treatment. After 10 min of the desoldering treatment, said waste printed circuit board proceeded to step (3), spent stripping solution thereof proceeded to step (2).

(2) Separation of lead and tin:

The spent stripping solution from step (1) was provided, which contains tin metal measured as 60 g/L, lead ions measured as 22 g/L, iron ions measured as 9 g/L and copper ions as measured by 10 g/L.

A stirring was started at 60° C., oxidant hydrogen peroxide was added, and the pH value was then regulated to 2.7 by adding alkali. The reaction was conducted for 3 h to precipitate $Fe^{3+}$ and $Sn^{4+}$ while leaving lead ions and copper ions remaining in the solution. Solid and liquid was separated by filtering. Tin-containing residues and lead-containing filtrate were obtained.

Purification of tin-containing residues: tin-containing residues were provided and slurried with water, ammonium sulfite was added to reduce to $Sn(OH)_2$ precipitates, then pH value was regulated to 13 by adding alkali, the reaction was conducted at 60° C. for 3 h to transform $Sn(OH)_2$ precipitates into soluble $[Sn(OH)_4]^{2-}$, filtering, the residues were ferric hydroxide, which were then returned for leaching. Sulfuric acid was added to filtrate, pH value was regulated to 3 to transform $[Sn(OH)_4]^{2-}$ into $Sn(OH)_2$, filtering, the pH value of $Sn(OH)_2$ was regulated to 0.5, after dissolving, tin sulfate solution was formed, and then tin sulfate crystals were formed by concentrating and crystallizing.

Purification of lead-containing filtrate: lead-containing filtrate was provided, sodium sulfate was added at 60° C. according to the excess coefficient of lead that was 1.2, the reaction was conducted for 4 h while stirring, filtering, residues were lead sulfate, filtrate was copper-containing filtrate; lead sulfate residues were provided and slurried, after that, sodium carbonate was added at a 80° C., pH value was regulated to 9, the reaction was conducted for 4 h to transform lead sulfate into tribasic lead sulfate products. Copper-containing filtrate was transferred to the leached solution from step (5).

(3) Crush and electrostatic separation: said desoldering treated circuit board from step (1) was provided, then dried, crushed roughly, eddy current separated, crushed finely and electrostatic separated. Robber and plastic materials were removed, and metal-rich part powders were obtained.

(4) Extraction of lead, antimony and aluminium: said metal-rich part powders from step (3) was provided, roasted at 500° C. for 1 h for the purpose of oxidizing lead, antimony, aluminum, copper, nickel and other metals, then the roasted materials were leached with alkali for 6 h, the liquid-solid ratio was 2:1, temperature of leaching was 90° C., filtrating, mixed crystals of $Na_2PbO_3$, $Na_2SbO_3$ and $NaAlO_2$ were obtained after the filtrate was evaporated and concentrated. Mother liquor was returned back for water leaching, residues without lead, antimony and aluminium proceeded to step (5).

(5) Extraction of copper: said residues without lead, antimony and aluminium from step (4) were provided, 0.5 mol/L of sulfuric acid solution and $Na_2S_2O_8$ were added, leaching at a temperature in a range of from 20° C. to 70° C. for 2 h. The leached solution was filtered. Selectively cyclone electrowinning copper, the conditions therein comprised: pH value of electrolyte was 1.0, temperature was 20° C., current density was 200 A/m$^2$, time of electrowinning was 4 h, electrowinning copper was obtained, residues without copper proceeded to step (7).

(6) Extraction of nickel: the remaining solution from step (5) was provided. Selectively cyclone electrowinning nickel, the conditions therein comprised: pH value of electrolyte was 1.0, temperature was 20° C., current density was 200 A/m$^2$, time of electrowinning was 4 h, electrowinning nickel was obtained, the remaining solution was returned back for sulfuric acid leaching.

(7) Extraction of silver: said residues without copper from step (5) were provided, nitric acid solution was added according to the concentration ratio of residues to nitric acid solution that was 1:1 to dissolve silver and palladium, the temperature was held at 25° C. to leach for 3 h, filtering, solid and liquid were separated, silver-and-palladium-containing filtrate and residues without silver and palladium were obtained. Then pH value of silver-and-palladium-containing filtrate was regulated to 3, a continuous stirring was started at normal temperature. NaOH solution was added to precipitate palladium while leaving silver ions remaining in the solution, filtering solid and liquid were separated; silver-containing filtrate and palladium-containing precipitates were obtained. Sodium chloride was added to said silver-containing filtrate to precipitate silver, filtering, solid and liquid were separated, silver chloride precipitates were obtained, residues without silver and palladium proceeded to step (8).

(8) Extraction of gold: said residues without silver and palladium from step (7) were provided, aqua regia in an amount by mass of 1~5 times the residues was added, stirring under 20° C. at a speed of 100 r/min, leaching for 2.5 h; cyclone electrowinning gold, the conditions therein comprised: temperature was 20° C., current density was 50 A/m$^2$, time of electrowinning was 4 h, pH value of electrolyte was 1.0, electrowinning gold was obtained, and the remaining solution proceeded to step (9).

(9) Extraction of platinum: the remaining solution from step (8) was provided, saturated $NH_4Cl$ was added to react for 2 h, then filtering, residues were ammonium chloroplatinate, platinum sponge was obtained after refinement, filtrate without platinum proceeded to step (10).

(10) Secondary extraction of palladium: the filtrate without platinum from step (9) was provided, methanoic acid according to the mass ratio of palladium to methanoic that was 0.5:1 was added, the reaction was conducted for 2 h while vigorously stirring at 50° C., pH value was held at 6.0, raw palladium powders were obtained.

The recycling rates of each metal were: tin 91%, lead 90%, antimony 91%, aluminium 91%, copper 99%, nickel 97%, silver 97%, gold 99%, platinum 98% and palladium 96%.

Example 2

The burning-free and non-cyanide method for recycling waste printed circuit board, comprising:

(1) Desoldering treatment:

Ferric nitrate or ferric chloride, sulfonic acid were provided and completely dissolved in water. Nitric acid was added according to the following proportion, and uniform stirring was started. Nitric acid type stripping solution of the present invention was obtained: nitric acid 15%, ferric nitrate 20%, sulfamic acid 5% and water for the rest.

Waste printed circuit board was provided, then washed, dried and immersed in nitric acid type stripping solution for desoldering treatment. After 10 min of the desoldering treatment, said waste printed circuit board proceeded to step (3), spent stripping solution thereof proceeded to step (2).

(2) Separation of lead and tin:

The spent stripping solution from step (1) was provided, which contains tin metal measured as 60 g/L, lead ions measured as 24 g/L, iron ions measured as 9 g/L and copper ions as measured by 9 g/L.

A stirring was started at 60° C., oxidant hydrogen peroxide was added, and the pH value was then regulated to 2.5 by adding alkali. The reaction was conducted for 3 h to precipitate $Fe^{3+}$ and $Sn^{4+}$ while leaving lead ions and copper ions remaining in the solution. Solid and liquid was separated by filtering. Tin-containing residues and lead-containing filtrate were obtained.

Purification of tin-containing residues: tin-containing residues were provided and slurried with water, ammonium sulfite was added to reduce to $Sn(OH)_2$ precipitates, then pH value was regulated to 13 by adding alkali, the reaction was conducted at 50° C. for 4 h to transform $Sn(OH)_2$ precipitates into soluble $[Sn(OH)_4]^{2-}$, filtering, the residues were ferric hydroxide, which were then returned for leaching. Sulfuric acid was added to filtrate, pH value was regulated to 3 to transform $[Sn(OH)_4]^{2-}$ into $Sn(OH)_2$, filtering, the pH value of $Sn(OH)_2$ was regulated to 0.5, after dissolving, tin sulfate solution was formed, and then tin sulfate crystals were formed by concentrating and crystallizing.

Purification of lead-containing filtrate: lead-containing filtrate was provided, sodium sulfate was added at 60° C. according to the excess coefficient of lead that was 1.1, the reaction was conducted for 5 h while stirring, filtering, residues were lead sulfate, filtrate was copper-containing filtrate; lead sulfate residues were provided and slurried, after that, sodium carbonate was added at 60° C., pH value was regulated to 9, the reaction was conducted for 5 h to transform lead sulfate into tribasic lead sulfate products. Copper-containing filtrate was transferred to the leached solution from step (5).

(3) Crush and electrostatic separation: said desoldering treated circuit board from step (1) was provided, then dried, crushed roughly, eddy current separated, crushed finely and electrostatic separated. Robber and plastic materials were removed, and metal-rich part powders were obtained.

(4) Extraction of lead, antimony and aluminium: said metal-rich part powders from step (3) was provided and mixed with fusion agent NaOH according to the mass ratio of metal-rich part powders to fusion agent that was 1:0.1, then smelted at 350° C. for 3.5 h, filtrating, mixed crystals of $Na_2PbO_3$, $Na_2SbO_3$ and $NaAlO_2$ were obtained after the filtrate was evaporated and concentrated. Mother liquor was returned back for water leaching, residues without lead, antimony and aluminium proceeded to step (5).

(5) Extraction of gold: said residues without lead, antimony and aluminium from step (4) were provided, 0.5 mol/L of sulfuric acid solution and $Na_2S_2O_8$ were added, leaching at a temperature in a range of from 20° C. to 70° C. for 2 h. The leached solution was filtered. Selectively cyclone electrowinning copper, the conditions therein comprised: pH value of electrolyte was 1.0, temperature was 20° C., current density was 200 A/m$^2$, time of electrowinning was 4 h, electrowinning copper was obtained, residues without copper proceeded to step (7).

(6) Extraction of nickel: the remaining solution from step (5) was provided. Selectively cyclone electrowinning nickel, the conditions therein comprised: pH value of electrolyte was 1.0, temperature was 20° C., current density was 200 A/m$^2$, time of electrowinning was 4 h, electrowinning nickel was obtained, the remaining solution was returned back for sulfuric acid leaching.

(7) Extraction of silver: said residues without copper from step (5) were provided, nitric acid solution was added according the concentration ratio of residues to nitric acid solution that was 1:1 to dissolve silver and palladium, the temperature was held at 25° C. to leach for 3 h, filtering, solid and liquid were separated, silver-and-palladium-containing filtrate and residues without silver and palladium were obtained. Then pH value of silver-and-palladium-containing filtrate was regulated to 3, a continuous stirring was started at normal temperature. NaOH solution was added to precipitate palladium while leaving silver ions remaining in the solution, filtering solid and liquid were separated; silver-containing filtrate and palladium-containing precipitates were obtained. Sodium chloride was added to said silver-containing filtrate to precipitate silver, filtering and solid and liquid were separated, silver chloride precipitates were obtained, residues without silver and palladium proceeded to step (8).

(8) Extraction of gold: said residues without silver and palladium from step (7) were provided, aqua regia in an amount by mass of 1 time as much as the residues was added, stirring under 20° C. at a speed of 100 r/min, leaching for 2.5 h; cyclone electrowinning gold, the conditions therein comprised: temperature was 20° C., current density was 50 A/m$^2$, time of electrowinning was 4 h, pH value of electrolyte was 1.0, electrowinning gold was obtained, and the remaining solution proceeded to step (9).

(9) Extraction of platinum: the remaining solution from step (8) was provided, saturated $NH_4Cl$ was added to react for 2 h, then filtering, residues were ammonium chloroplatinate, platinum sponge was obtained after refinement, filtrate without platinum proceeded to step (10).

(10) Secondary extraction of palladium: the filtrate without platinum from step (9) was provided, methanoic acid according to the mass ratio of palladium to methanoic acid that was 0.5:1 was added, the reaction was conducted for 2 h while vigorously stirring at 50° C., pH value was held at 6.0, raw palladium powders were obtained.

The recycling rates of each metal were: tin 92%, lead 91%, antimony 90%, aluminium 91.3%, copper 99.2%, nickel 97%, silver 96.5%, gold 99.5%, platinum 98.6% and palladium 96.1%.

Example 3

The burning-free and non-cyanide method for recycling waste printed circuit board, comprising:

(1) Desoldering treatment:

Ferric nitrate or ferric chloride, sulfonic acid were provided and completely dissolved in water. Nitric acid was added according to the following proportion, and uniform stirring was started. Nitric acid type stripping solution of the present invention was obtained: nitric acid 50%, ferric chloride 1%, sulfamic acid 1% and water for the rest.

Waste printed circuit board was provided, then washed, dried and immersed in nitric acid type stripping solution for desoldering treatment. After 25 min of the desoldering treatment, said waste printed circuit board proceeded to step (3), spent stripping solution thereof proceeded to step (2).

(2) Separation of lead and tin:

The spent stripping solution from step (1) was provided, which contains tin metal measured as 60~100 g/L, lead ions measured as 36 g/L, iron ions measured as 24 g/L and copper ions as measured by 12 g/L.

A stirring was started at 95° C., oxidant sodium chlorate was added, and the pH value was then regulated to 3.0 by adding alkali. The reaction was conducted for 3 h to precipitate $Fe^{3+}$ and $Sn^{4+}$ while leaving lead ions and copper ions remaining in the solution. Solid and liquid was separated by filtering. Tin-containing residues and lead-containing filtrate were obtained.

Purification of tin-containing residues: tin-containing residues were provided and slurried with water, ammonium sulfite was added to reduce to $Sn(OH)_2$ precipitates, then pH value was regulated to 14 by adding alkali, the reaction was conducted at 95° C. for 1 h to transform $Sn(OH)_2$ precipitates into soluble $[Sn(OH)_4]^{2-}$, filtering, the residues were ferric hydroxide, which were then returned for leaching. Sulfuric acid was added to filtrate, pH value was regulated to 7 to transform $[Sn(OH)_4]^{2-}$ into $Sn(OH)_2$, filtering, the pH value of $Sn(OH)_2$ was regulated to 1, after dissolving, tin sulfate solution was formed, and then tin sulfate crystals were formed by concentrating and crystallizing.

Purification of lead-containing filtrate: lead-containing filtrate was provided, sodium sulfate was added at 95° C. according to the excess coefficient of lead that was 1.5, the reaction was conducted for 0.5 h while stirring, filtering, residues were lead sulfate, filtrate was copper-containing filtrate; lead sulfate residues were provided and slurried, after that, sodium carbonate was added at 95° C., pH value was regulated to 10, the reaction was conducted for 2 h to transform lead sulfate into tribasic lead sulfate products. Copper-containing filtrate was transferred to the leached solution from step (5).

(3) Crush and electrostatic separation: said desoldering treated circuit board from step (1) was provided, then dried, crushed roughly, eddy current separated, crushed finely and electrostatic separated. Robber and plastic materials were removed, and metal-rich part powders were obtained.

(4) Extraction of lead, antimony and aluminium: said metal-rich part powders from step (3) was provided and mixed with fusion agent which is $NaOH:NaNO_3=1:1$ according to mass ratio of 1:1, then smelted at 550° C. for 1 h, filtrating, mixed crystals of $Na_2PbO_3$, $Na_2SbO_3$ and $NaAlO_2$ were obtained after the filtrate was evaporated and concentrated. Mother liquor was returned back for water leaching, residues without lead, antimony and aluminium proceeded to step (5).

(5) Extraction of copper: said residues without lead, antimony and aluminium from step (4) were provided, 3.5 mol/L of sulfuric acid solution and hydrogen peroxide were added, leaching at 70° C. for 2 h. The leached solution was filtered. Selectively cyclone electrowinning copper, the conditions therein comprised: pH value of electrolyte was 5.0, temperature was 60° C., current density was 550 A/m$^2$, time of electrowinning was 0.5 h, electrowinning copper was obtained, residues without copper proceeded to step (7).

(6) Extraction of nickel: the remaining solution from step (5) was provided. Selectively cyclone electrowinning nickel, the conditions therein comprised: pH value of electrolyte was 5.0, temperature was 70° C., current density was 450 A/m$^2$, time of electrowinning was 0.5 h, electrowinning nickel was obtained, the remaining solution was returned back for sulfuric acid leaching.

(7) Extraction of silver: said residues without copper from step (5) were provided, nitric acid solution was added according to the concentration ratio of residues to nitric acid solution that was 1:1 to dissolve silver and palladium, the temperature was held at 85° C. to leach for 0.5 h, filtering, solid and liquid were separated, silver-and-palladium-containing filtrate and residues without silver and palladium were obtained. Then pH value of silver-and-palladium-containing filtrate was regulated to 5, a continuous stirring was started at normal temperature. NaOH solution was added to precipitate palladium while leaving silver ions remaining in the solution, filtering solid and liquid were separated; silver-containing filtrate and palladium-containing precipitates were obtained. Sodium chloride was added to said silver-containing filtrate to precipitate silver, filtering, and solid and liquid were separated, silver chloride precipitates were obtained, residues without silver and palladium proceeded to step (8).

(8) Extraction of gold: said residues without silver and palladium from step (7) were provided, aqua regia in an amount by mass of 5 time as much as the residues was added, stirring under 70° C. at a speed of 1000 r/min, leaching for 1 h; cyclone electrowinning gold, the conditions therein comprised: temperature was 60° C., current density was 400 A/m$^2$, time of electrowinning was 0.5 h, pH value of electrolyte was 5.5, electrowinning gold was obtained, and the remaining solution proceeded to step (9).

(9) Extraction of platinum: the remaining solution from step (8) was provided, saturated $NH_4Cl$ was added to react for 8 h, then filtering, residues were ammonium chloroplatinate, platinum sponge was obtained after refinement, filtrate without platinum proceeded to step (10).

(10) Secondary extraction of palladium: the filtrate without platinum from step (9) was provided, methanoic acid according to the mass ratio of palladium to methanoic that was 3:1 was added, the reaction was conducted for 0.5 h while vigorously stirring at 90° C., pH value was held at 9.0, raw palladium powders were obtained.

The recycling rates of each metal were: tin 92%, lead 90%, antimony 91%, aluminium 92%, copper 99%, nickel 96%, silver 96%, gold 99%, platinum 98% and palladium 96%.

What is claimed is:

1. A burning-free and non-cyanide method for recycling waste printed circuit board, comprising:
   (1) desoldering treatment: providing waste printed circuit board, washing, drying, immersing in nitric acid type stripping solution for desoldering treatment, after the desoldering treatment, said waste printed circuit board proceeds to step (3), spent stripping solution thereof proceeds to step (2);
   (2) separation of lead and tin: providing said spent stripping solution from step (1), stirring under a temperature in a range of from 60° C. to 95° C., adding oxidant, regulating pH to from 2.5 to 3.0 by adding alkali, reacting for from 1 to 3 h to precipitate $Fe^{3+}$ and $Sn^{4+}$ while leaving lead ions and copper ions remaining in solution, filtering and separating solid and liquid, obtaining tin-containing residues and lead-containing filtrate, recycling tin and lead respectively;
   (3) crush and electrostatic separation: providing said desoldering treated circuit board from step (1), drying, crushing roughly, eddy current separating, crushing finely and electrostatic separating, removing robber and plastic materials, obtaining metal-rich part powders;
   (4) extraction of lead, antimony and aluminium: providing said metal-rich part powders from step (3), leaching Pb ions, Sb ions and Al ions, filtering, evaporating and concentrating filtrate to obtain mixed crystals of $Na_2PbO_3$, $Na_2SbO_3$ and $NaAlO_2$, evaporating mother liquor to return back for water leaching, residues without lead, antimony and aluminium proceed to step (5);

(5) extraction of copper: providing said residues without lead, antimony and aluminium from step (4), adding 0.5~3.5 mol/L of sulfuric acid solution and oxidant, leaching at a temperature in a range of from 20° C. to 70° C. for from 2 to 8 h, filtering the leached solution, selectively cyclone electrowinning copper, the conditions therein comprise: pH value of electrolyte is in a range of from 1.0 to 5.0, temperature is in a range of from 20° C. to 60° C., current density is in a range of from 200 A/m$^2$ to 550 A/m$^2$, time of electrowinning is in a range of from 0.5 h to 4 h, obtaining electrowinning copper, residues without copper proceed to step (7);

(6) extraction of nickel: providing the remaining solution from step (5), selectively cyclone electrowinning nickel, the conditions therein comprise: pH value of electrolyte is in a range of from 1.0 to 5.0, temperature is in a range of from 20° C. to 70° C., current density is in a range of from 200 A/m$^2$ to 450 A/m$^2$, time of electrowinning is in a range of from 0.5 h to 4 h, obtaining electrowinning nickel, the remaining solution is returned back for sulfuric acid leaching;

(7) extraction of silver: providing said residues without copper from step (5), adding nitric acid solution according concentration ratio of residues to nitric acid solution that 1:1~3 to dissolve silver and palladium, holding the temperature at from 25° C. to 85° C. and leaching for from 0.5 h to 3 h, filtering and separating solid and liquid, obtaining silver-and-palladium-containing filtrate, and obtaining residues without silver and palladium, then regulating pH value of silver-and-palladium-containing filtrate to from 3 to 5, stirring continuously at normal temperature, adding NaOH solution to precipitate palladium while leaving silver ions remaining in the solution, filtering and separating solid and liquid, obtaining silver-containing filtrate and palladium-containing precipitates, adding sodium chloride to said silver-containing filtrate to precipitate silver, filtering and separating solid and liquid, obtaining silver chloride precipitates, residues without silver and palladium proceed to step (8);

(8) extraction of gold: providing said residues without silver and palladium from step (7), adding aqua regia in an amount by mass of 1~5 times the residues, stirring under a temperature in a range of from 20° C. to 70° C. at a speed in a range of from 100 r/min to 1000 r/min, leaching for from 1 h to 2.5 h; cyclone electrowinning gold in the leached liquid, the conditions therein comprise: temperature is in a range of from 20° C. to 60° C., current density is in a range of from 50 A/m$^2$ to 400 A/m$^2$, time of electrowinning is in a range of from 0.5 h to 4 h, pH value of electrolyte is in a range of from 1.0 to 5.5, obtaining electrowinning gold, the remaining solution proceeds to step (9);

(9) extraction of platinum: providing the remaining solution from step (8), adding saturated NH$_4$Cl to react for from 2 h to 8 h, then filtering, residues are ammonium chloroplatinate, platinum sponge is obtained after refinement, filtrate without platinum proceeds to step (10);

(10) secondary extraction of palladium: providing said filtrate without platinum from step (9), adding methanoic acid according to the mass ratio of palladium to methanoic acid that 0.5~3:1, reacting for from 0.5 h to 2 h while vigorously stirring at a temperature in a range of from 50° C. to 90° C., holding pH value at from 6.0 to 9.0, obtaining raw palladium powders.

2. The method as claimed in claim 1, wherein said nitric acid type stripping solution from step (1) contains the following components in weight percent: nitric acid 15~50%, ferric nitrate or ferric chloride 1~20%, sulfonic acid 1~5% and water for the rest.

3. The method as claimed in claim 2, wherein said nitric acid type stripping solution contains the following components in weight percent: nitric acid 30~50%, ferric nitrate or ferric chloride 10~18%, sulfonic acid 3~5% and water for the rest.

4. The method as claimed in claim 3, wherein said nitric acid type stripping solution contains the following components in weight percent: nitric acid 50%, ferric nitrate or ferric chloride 18%, sulfonic acid 5% and water for the rest.

5. The method as claimed in claim 1, wherein the time of said desoldering treatment is in a range of from 10 min to 25 min.

6. The method as claimed in claim 1, wherein said step of recovering tin from step (2) involves purifying tin-containing residues: providing tin-containing residues and pulpifying with water, adding ammonium sulfite to reduce to Sn(OH)$_2$ precipitates, then adding alkali to regulate pH value to from 13 to 14, reacting at a temperature in a range of from 50° C. to 95° C. for from 1 h to 4 h to transform Sn(OH)$_2$ precipitates into soluble [Sn(OH)$_4$]$^{2-}$, filtering, the residues are ferric hydroxide which are returned back for leaching, adding sulfuric acid to filtrate, regulating pH value back to from 3 to 7 to transform [Sn(OH)$_4$]$^{2-}$ into Sn(OH)$_2$, filtering, regulating pH value of Sn(OH)$_2$ to from 0.5 to 1, dissolving and forming tin sulfate solution, then concentrating and crystallizing to form tin sulfate crystals.

7. The method as claimed in claim 1, wherein said step of recovering lead from step (2) involves purifying lead-containing residues: providing lead-containing filtrate, adding sodium sulfate at a temperature in a range of from 60° C. to 95° C. according to excess coefficient of lead 1.1~1.5, reacting for from 0.5 h to 5 h while stirring, filtering, residues are lead sulfate, filtrate is copper-containing filtrate; providing lead sulfate residues and pulpifying, after that, adding sodium carbonate at a temperature in a range of from 60° C. to 95° C., regulating pH value to from 9 to 10, reacting for from 2 h to 5 h to transform lead sulfate into tribasic lead sulfate products.

8. The method as claimed in claim 7, wherein said copper-containing filtrate is transferred to leached solution from step (5).

9. The method as claimed in claim 1, wherein said step of leaching Pb ions, Sb ions and Al ions from step (4) involves: roasting the metal-rich part powders at a temperature in a range of 300° C. to 500° C. for from 1 h to 5 h, then leaching the roasted materials with alkali for from 2 h to 6 h, the liquid-solid ratio is in a range of 2~5:1, the temperature of leaching is in a range of 60° C. to 90° C.

10. The method as claimed in claim 1, wherein said step of leaching Pb ions, Sb ions and Al ions from step (4) involves: thoroughly mixing metal-rich part powders with fusion agent which is NaOH:NaNO$_3$=1:0~1 according to mass ratio of metal-rich part powders to fusion agent that 1:0.1~1, smelting at a temperature in a range of 350° C. to 550° C. for from 1 h to 3.5 h, the smelted materials are leached out with hot water after cooling and levigating, liquid-solid ratio is in a range of 1~5:1, temperature of leaching is in a range of from 20° C. to 40° C.

* * * * *